United States Patent
Levesque

(10) Patent No.: US 9,320,177 B2
(45) Date of Patent: Apr. 19, 2016

(54) DATA CENTER COOLING SYSTEM

(75) Inventor: Pierre Levesque, La Prairie (CA)

(73) Assignee: LE GROUPE S.M. INC., Montreal (CA)

( * ) Notice: Subject to any disclaimer, the term of this patent is extended or adjusted under 35 U.S.C. 154(b) by 148 days.

(21) Appl. No.: 14/360,194

(22) PCT Filed: Nov. 22, 2011

(86) PCT No.: PCT/US2011/061870
§ 371 (c)(1),
(2), (4) Date: Oct. 27, 2014

(87) PCT Pub. No.: WO2013/077858
PCT Pub. Date: May 30, 2013

(65) Prior Publication Data
US 2015/0156926 A1 Jun. 4, 2015

(51) Int. Cl.
*H05K 7/20* (2006.01)
*H01L 23/473* (2006.01)

(52) U.S. Cl.
CPC .......... *H05K 7/20836* (2013.01); *H05K 7/2079* (2013.01); *H05K 7/20263* (2013.01); *H05K 7/20272* (2013.01); *H05K 7/20745* (2013.01)

(58) Field of Classification Search
CPC . G06F 1/181–1/182; H05K 7/20218–7/20381; H05K 7/20409–7/20418; H05K 7/20009–7/202; H01L 23/46–23/3677
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | |
|---|---|---|---|
| 3,843,910 | A | 10/1974 | Ringuet et al. |
| 5,249,741 | A | 10/1993 | Bistline et al. |
| 5,718,628 | A | 2/1998 | Nakazato et al. |
| 6,616,524 | B2 | 9/2003 | Storck et al. |
| 6,672,955 | B2 | 1/2004 | Charron et al. |

(Continued)

FOREIGN PATENT DOCUMENTS

| | | |
|---|---|---|
| JP | 2011133129 A | 7/2011 |
| WO | 2007/082351 A1 | 7/2007 |

(Continued)

OTHER PUBLICATIONS

International Search Report/Written Opinion issued in corresponding PCT/US2011/061870, filed Nov. 22, 2011.

*Primary Examiner* — Anthony Haughton
*Assistant Examiner* — Razmeen Gafur
(74) *Attorney, Agent, or Firm* — Kathleen D. Rigaut; Dann, Dorfman, Herrell & Skillman

(57) ABSTRACT

A data center has a room having a cold aisle and a hot aisle and a plurality of electronic components disposed between the cold and hot aisles. At least one air-to-liquid heat exchanger is disposed between the hot and cold aisles. At least one first fan circulates air in the room at a first flow rate. The at least one first fan circulates air through the at least one air-to-liquid heat exchanger from the hot aisle to the cold aisle. An air supply system is fluidly connected to the room. The air supply system includes an air filter, and a second fan supplying air from outside the room to the room at a second flow rate. The second flow rate is lower than the first flow rate. A data center cooling system and a data center having the data center cooling system are also disclosed.

46 Claims, 7 Drawing Sheets

(56) References Cited

U.S. PATENT DOCUMENTS

| | | |
|---|---|---|
| 6,817,199 B2 | 11/2004 | Patel et al. |
| 7,085,133 B2 | 8/2006 | Hall et al. |
| 7,430,118 B1 | 9/2008 | Noteboom et al. |
| 7,508,665 B1 | 3/2009 | Palmer et al. |
| 7,752,858 B2 | 7/2010 | Johnson et al. |
| 7,753,766 B2 | 7/2010 | Master et al. |
| 7,841,199 B2 | 11/2010 | VanGilder et al. |
| 7,907,395 B2 | 3/2011 | Weber et al. |
| 7,961,463 B2 | 6/2011 | Belady et al. |
| 8,004,839 B2 | 8/2011 | Sato et al. |
| 8,184,435 B2* | 5/2012 | Bean, Jr. ............ H05K 7/20745 165/104.33 |
| 8,982,552 B2* | 3/2015 | Roesner ................. G06F 13/14 165/104.33 |
| 2004/0223300 A1* | 11/2004 | Fink ........................ H05K 7/20 361/690 |
| 2005/0237716 A1 | 10/2005 | Chu et al. |
| 2007/0139883 A1 | 6/2007 | Pinkerton et al. |
| 2007/0165377 A1* | 7/2007 | Rasmussen .......... H05K 7/2079 361/695 |
| 2007/0209782 A1 | 9/2007 | Wyatt et al. |
| 2007/0283710 A1 | 12/2007 | Gilbert et al. |
| 2008/0055850 A1 | 3/2008 | Carlson et al. |
| 2008/0174954 A1* | 7/2008 | VanGilder .......... H05K 7/20836 361/679.54 |
| 2008/0180908 A1* | 7/2008 | Wexler ............... H05K 7/20745 361/690 |
| 2008/0204999 A1 | 8/2008 | Clidaras et al. |
| 2008/0291626 A1 | 11/2008 | Nelson et al. |
| 2009/0150129 A1* | 6/2009 | Archibald ................. G06F 1/20 703/5 |
| 2009/0173017 A1 | 7/2009 | Hall et al. |
| 2009/0241578 A1* | 10/2009 | Carlson ................... F25D 17/06 62/259.2 |
| 2009/0251860 A1* | 10/2009 | Belady ............... H05K 7/20745 361/690 |
| 2009/0262501 A1* | 10/2009 | Claassen .................. G06F 1/20 361/701 |
| 2010/0048119 A1 | 2/2010 | Tashiro et al. |
| 2010/0061057 A1* | 3/2010 | Dersch ............... H05K 7/20745 361/690 |
| 2010/0149754 A1* | 6/2010 | Chapel ............... H05K 7/20745 361/696 |
| 2010/0188816 A1* | 7/2010 | Bean, Jr. ............ H05K 7/20745 361/696 |
| 2010/0263830 A1* | 10/2010 | Noteboom ........... H05K 7/2079 165/80.2 |
| 2010/0304657 A1 | 12/2010 | Gallman et al. |
| 2010/0307171 A1 | 12/2010 | Hamann et al. |
| 2010/0315775 A1* | 12/2010 | Grantham .......... H05K 7/20745 361/688 |
| 2011/0009047 A1 | 1/2011 | Noteboom et al. |
| 2011/0014862 A1 | 1/2011 | Honold et al. |
| 2011/0100618 A1 | 5/2011 | Carlson et al. |
| 2011/0122570 A1* | 5/2011 | Beck .................. H05K 7/20745 361/679.46 |
| 2011/0128699 A1* | 6/2011 | Heydari ............. H05K 7/20745 361/679.48 |
| 2011/0154842 A1 | 6/2011 | Heydari et al. |
| 2011/0195652 A1 | 8/2011 | Smith et al. |
| 2011/0223849 A1 | 9/2011 | Ishimine et al. |
| 2011/0242755 A1* | 10/2011 | Zeighami ........... F24F 11/0001 361/679.46 |
| 2012/0014060 A1* | 1/2012 | Slessman .......... H05K 7/20736 361/691 |
| 2012/0026691 A1* | 2/2012 | Campbell .......... H05K 7/20781 361/700 |
| 2012/0063082 A1* | 3/2012 | Chang ................ H05K 7/20745 361/679.47 |
| 2012/0075794 A1* | 3/2012 | Wei .................... H05K 7/20745 361/679.48 |
| 2012/0236487 A1* | 9/2012 | Wallace ............. H05K 7/20727 361/679.31 |
| 2012/0281352 A1* | 11/2012 | Namek ............... H05K 7/20745 361/679.46 |
| 2012/0281358 A1* | 11/2012 | Chainer ............. H05K 7/20772 361/700 |

FOREIGN PATENT DOCUMENTS

| | | |
|---|---|---|
| WO | 2007/139558 A1 | 12/2007 |
| WO | 2011062580 | 5/2011 |
| WO | 2011073668 | 6/2011 |

* cited by examiner

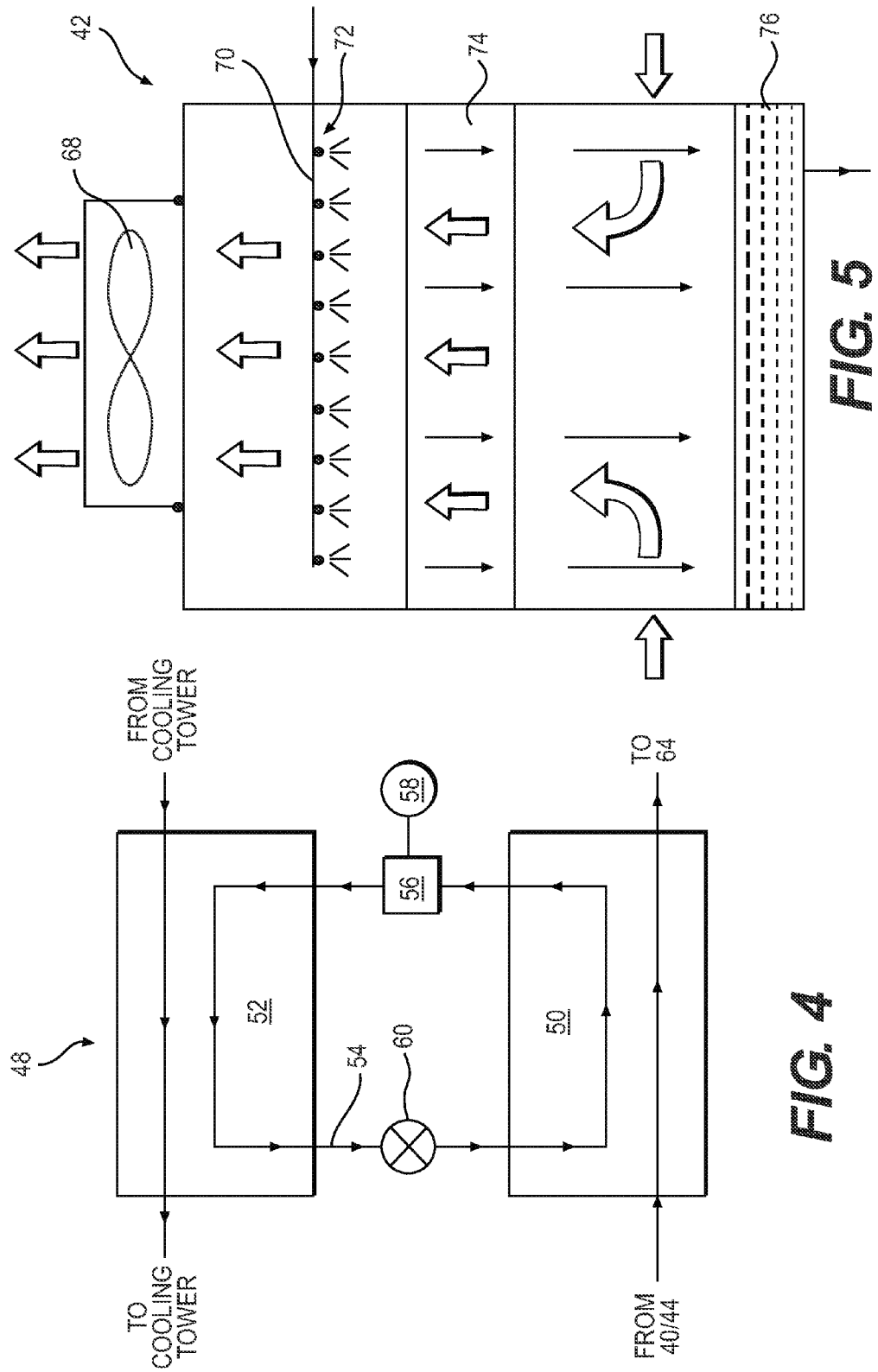

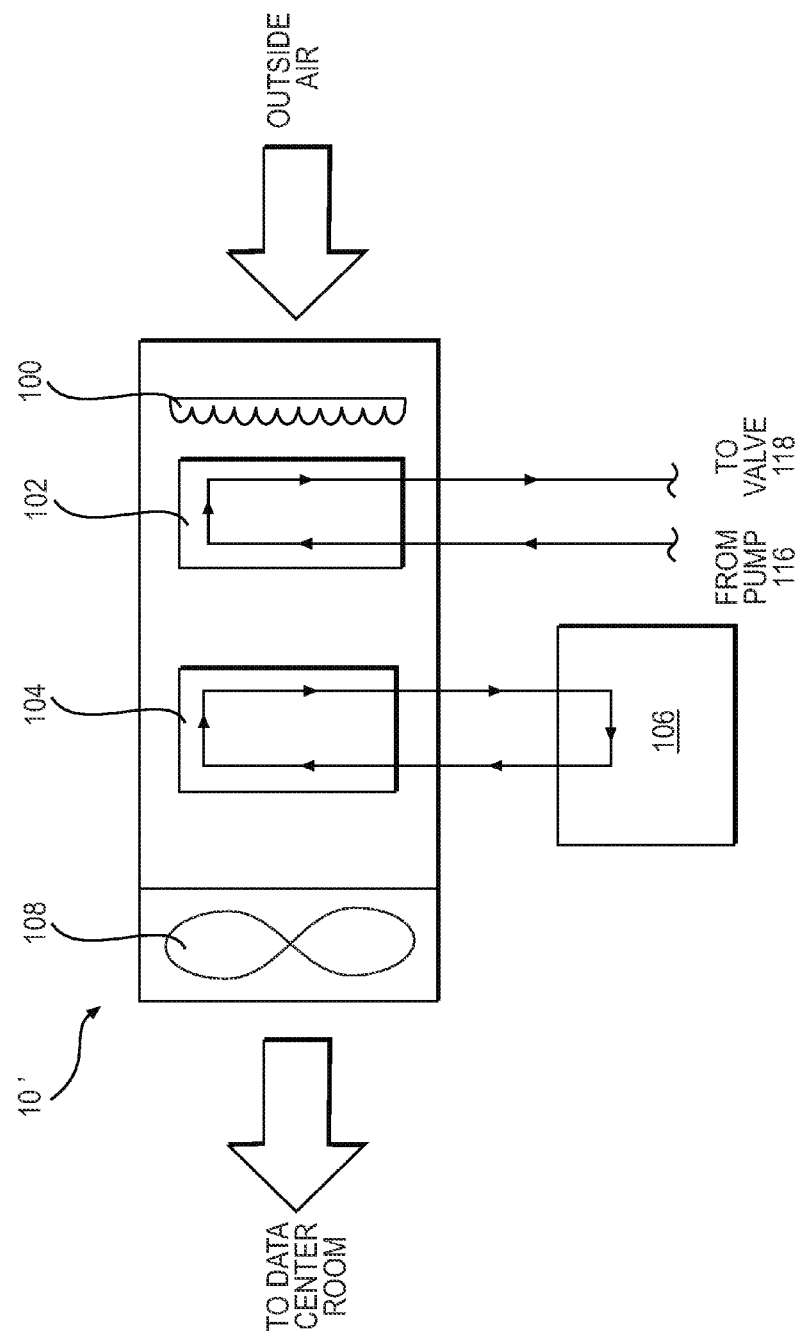

DATA CENTER COOLING SYSTEM

FIELD OF THE INVENTION

The present invention relates to data center cooling systems, methods of cooling data centers, and data centers having such systems and using such methods.

BACKGROUND

A data center is a facility inside which are stored at least one of general or special purpose computers, servers, electronic data storage, telecommunication devices, and combinations thereof. These electronic components are typically stored in racks inside the data center. As would be understood, in order to operate, the electronic components need to be supplied with electricity. During operation of the electronic components, a major portion of the electricity used by the components is converted to heat.

In order for these components to operate efficiently, they have to operate in a controlled environment where there is very little dust and where the humidity and temperature are also controlled. As such, the heat generated by the electronic components has to be removed in order for the electronic components to operate within an acceptable range of temperature and to avoid failures of these components. The amount of power and the costs used for the removal of this heat is one of the major sources of power consumption and costs associated with the operation of data centers.

The efficiency of a data center is typically defined by a parameter referred to as the Power Usage Effectiveness (PUE). The PUE is the ratio of the total power consumed by the data center to the power consumed by the electronic components. As such, by reducing the amount of power necessary to cool the data center, the PUE of the data center also improves, which typically translates into lower operating costs.

Therefore, there is a need for a system for cooling a data center. There is also a need for a method of cooling a data center. There is also a need for a data center using such a system and/or method.

SUMMARY

It is an object of the present invention to ameliorate at least some of the inconveniences present in the prior art.

In one aspect, the present provides a data center having a room having a cold aisle and a hot aisle and a plurality of electronic components disposed between the cold aisle and the hot aisle. Air in the room circulating through the plurality of electronic components from the cold aisle to the hot aisle. At least one air-to-liquid heat exchanger is disposed between the hot aisle and the cold aisle. At least one first fan circulates air in the room at a first flow rate. The at least one first fan circulates air through the at least one air-to-liquid heat exchanger from the hot aisle to the cold aisle. An air supply system is fluidly connected to the room for supplying air from outside the room to the room. The air supply system includes an air filter, and a second fan supplying air from outside the room to the room at a second flow rate. The second flow rate is lower than the first flow rate.

In an additional aspect, the at least one air-to-liquid heat exchanger is filterless.

In a further aspect, the second flow rate is between 0.1% and 25% of the first flow rate.

In an additional aspect, the second flow rate is between 2% and 5% of the first flow rate.

In a further aspect, the at least one air-to-liquid heat exchanger is at least one first air-to-liquid heat exchanger. The air supply system further includes at least one second air-to-liquid heat exchanger. The at least one second fan circulates air through the at least one second air-to-liquid heat exchanger.

In an additional aspect, the at least one second air-to-liquid heat exchanger selectively heats the air from the outside before the air is supplied to the room using hot coolant exiting the at least one first air-to-liquid heat exchanger. The at least one second air-to-liquid heat exchanger selectively cools the air from the outside before the air is supplied to the room using cool coolant supplied to the at least one first air-to-liquid heat exchanger.

In a further aspect, a liquid-to-liquid heat exchanger is fluidly connected to the at least one second air-to-liquid heat exchanger. At least one pump circulates coolant between the liquid-to-liquid heat exchanger and the at least one second air-to-liquid heat exchanger. At least one valve selectively supplies one of the hot coolant and the cool coolant to the liquid-to-liquid heat exchanger.

In an additional aspect, at least one valve selectively supplies one of the hot coolant and the cool coolant to the second air-to-liquid heat exchanger. At least one pump circulates the one of the hot coolant and the cool coolant through the second air-to-liquid heat exchanger.

In a further aspect, the air supply system further includes an air-to-coolant heat exchanger disposed downstream of at least one second air-to-liquid heat exchanger, and an autonomous refrigeration system fluidly connected to the air-to-coolant heat exchanger. The autonomous refrigeration system cools coolant flowing through the air-to-coolant heat exchanger.

In an additional aspect, the air-to-coolant heat exchanger is a third air-to-liquid heat exchanger.

In a further aspect, the hot coolant is at a temperature of at least 18 degrees Celsius and the cool coolant is at a temperature between 8 degrees Celsius and 18 degrees Celsius.

In an additional aspect, the coolant is at least one of water and antifreeze.

In a further aspect, at least one air temperature sensor is disposed in the hot aisle for sensing an air temperature in the hot aisle, at least one first air pressure sensor is disposed in the hot aisle for sensing an air pressure in the hot aisle, and at least one second air pressure sensor is disposed in the cold aisle for sensing an air pressure in the cold aisle. A speed of the at least one first fan is increased to increase the first flow rate such that the air pressure in the cold aisle is increased relative to the hot aisle when the air temperature in the hot aisle is above a predetermined temperature. The speed of the at least one first fan is decreased to decrease the first flow rate such that the air pressure in the cold aisle is decreased relative to the hot aisle when the air temperature in the hot aisle is below the predetermined temperature.

In an additional aspect, the second flow rate is substantially constant.

In a further aspect, the predetermined temperature is between 26 degrees Celsius and 38 degrees Celsius.

In an additional aspect, at least one air temperature sensor is disposed in the cold aisle for sensing an air temperature in the cold aisle. A flow rate of coolant in the at least one air-to-liquid heat exchanger is increased when the air temperature in the cold aisle is above a predetermined temperature. The flow rate of coolant in the at least one air-to-liquid heat exchanger is decreased when the air temperature in the cold aisle is below the predetermined temperature.

In a further aspect, a temperature of coolant supplied to the at least one air-to-liquid heat exchanger is substantially constant.

In an additional aspect, the predetermined temperature is between 15 degrees Celsius and 25 degrees Celsius.

In a further aspect, the at least one air temperature sensor is disposed in the cold aisle for sensing an air temperature in the cold aisle. A temperature of coolant supplied to the at least one air-to-liquid heat exchanger is decreased when the air temperature in the cold aisle is above a predetermined temperature. The temperature of coolant supplied to the at least one air-to-liquid heat exchanger is increased when the air temperature in the cold aisle is below the predetermined temperature.

In an additional aspect, a plurality of racks is disposed between the cold aisle and the hot aisle. The plurality of electronic components is disposed in the plurality of racks.

In another aspect, the present provides a data center cooling system having at least one air-to-liquid heat exchanger adapted to cool air from a hot aisle of at least one room of a data center, a liquid-to-liquid heat exchanger fluidly connected to the at least one air-to-liquid heat exchanger, a first chiller fluidly connected to the liquid-to-liquid heat exchanger, a second chiller fluidly connected to the first chiller, at least one first pump fluidly connected to the at least one air-to-liquid heat exchanger for pumping a first coolant from the at least one air-to-liquid heat exchanger, the first coolant flowing selectively to the liquid-to-liquid heat exchanger, and to the first and second chillers prior to flowing back to the at least one air-to-liquid heat exchanger, a free cooling unit fluidly connected to the liquid-to-liquid heat exchanger for cooling the first coolant flowing therethrough and fluidly connected to the first and second chillers for condensing refrigerant circulated therein, and at least one second pump fluidly connected to the free cooling unit for pumping a second coolant from the free cooling unit, the second coolant flowing selectively to the liquid-to-liquid heat exchanger, and to the first and second chillers prior to flowing back to the free cooling unit. The at least one air-to-liquid heat exchanger, the liquid-to-liquid heat exchanger, the first chiller and the second chiller are fluidly connected in series. When the first coolant flows to the liquid-to-liquid heat exchanger and to the first and second chillers, the first coolant flows sequentially from the at least one air-to-liquid heat exchanger, to the liquid-to-liquid heat exchanger, to the first chiller, to the second chiller, and back to the at least one air-to-liquid heat exchanger.

In a further aspect, the free cooling unit, the liquid-to-liquid heat exchanger, the first chiller and the second chiller are connected in series.

In an additional aspect, when the second coolant flows to the liquid-to-liquid heat exchanger and to the first and second chillers, the second coolant flows sequentially from the free cooling unit, to the liquid-to-liquid heat exchanger, to the second chiller, to the first chiller, and back to the free cooling unit.

In a further aspect, the free cooling unit is a cooling tower and the second coolant is water.

In an additional aspect, the free cooling unit is a dry cooler.

In a further aspect, the second coolant is at least in part antifreeze.

In an additional aspect, a first valve has a first position where the second coolant flows through the liquid-to-liquid heat exchanger and a second position where at least a portion of the second coolant bypasses the liquid-to-liquid heat exchanger, a second valve has a first position where the second coolant flows through the first chiller and a second position where at least a portion of the second coolant bypasses the first chiller, and a third valve has a first position where the second coolant flows through the second chiller and a second position where at least a portion of the second coolant bypasses the second chiller.

In a further aspect, the at least one second pump is fluidly connected between the free cooling unit and the liquid-to-liquid heat exchanger.

In an additional aspect, a first valve has a first position where the first coolant flows through the liquid-to-liquid heat exchanger and a second position where at least a portion of the first coolant bypasses the liquid-to-liquid heat exchanger, a second valve has a first position where the first coolant flows through the first chiller and a second position where at least a portion of the first coolant bypasses the first chiller, and a third valve has a first position where the first coolant flows through the second chiller and a second position where at least a portion of the first coolant bypasses the second chiller.

In a further aspect, a fourth valve has a first position where the second coolant flows through the liquid-to-liquid heat exchanger and a second position where at least a portion of the second coolant bypasses the liquid-to-liquid heat exchanger, a fifth valve has a first position where the second coolant flows through the first chiller and a second position where at least a portion of the second coolant bypasses the first chiller, a sixth valve has a first position where the second coolant flows through the second chiller and a second position where at least a portion of the second coolant bypasses the second chiller. The fourth valve is in the first position when the first valve is in the first position. The fifth valve is in the first position when the second valve is in the first position. The sixth valve is in the first position when the third valve is in the first position. The fourth valve is in the second position when the first valve is in the second position. The fifth valve is in the second position when the second valve is in the second position. The sixth valve is in the second position when the third valve is in the second position.

In an additional aspect, a first temperature sensor senses a temperature of the first coolant upstream of the liquid-to-liquid heat exchanger, and a second temperature sensor senses a temperature of the second coolant upstream of the liquid-to-liquid heat exchanger. The first valve is in the second position at least when the temperature of the second coolant sensed by the second temperature sensor is above the temperature of the first coolant sensed by the first temperature sensor.

In a further aspect, the first valve is in the first position when the temperature of the second coolant sensed by the second temperature sensor is below the temperature of the first coolant sensed by the first temperature sensor by at least a predetermined amount.

In an additional aspect, the predetermined amount is between 0.1 and 10 degrees.

In a further aspect, a temperature sensor senses a temperature of the first coolant downstream of the liquid-to-liquid heat exchanger and upstream of the first chiller. The second valve is in the second position when the temperature of the first coolant sensed by the temperature sensor is at or below a predetermined temperature. The third valve is in the second position when the temperature of the first coolant sensed by the temperature sensor is at or below the predetermined temperature. The predetermined temperature is a temperature at which the first coolant is to be supplied to the at least one air-to-liquid heat exchanger.

In an additional aspect, at least one of the second valve and the third valve is in the first position when the temperature of the first coolant sensed by the temperature sensor is above the predetermined temperature.

In a further aspect, for an equivalent flow rate of the first coolant, one of the second valve and the third valve is in the first position when the temperature of the first coolant sensed by the temperature sensor is above the predetermined temperature by a first amount, and both of the second valve and the third valve are in the first position when the temperature of the first coolant sensed by the temperature sensor is above the predetermined temperature by a second amount, the second amount being greater than the first amount.

In an additional aspect, the predetermined temperature is between 8 degrees Celsius and 18 degrees Celsius.

In a further aspect, the at least one first pump is fluidly connected between the at least one air-to-liquid heat exchanger and the liquid-to-liquid heat exchanger.

In an additional aspect, the at least one air-to-liquid heat exchanger is a plurality of air-to-liquid heat exchangers fluidly connected in parallel.

In a further aspect, the at least one air-to-liquid heat exchanger is at least one coil.

In an additional aspect, the liquid-to-liquid heat exchanger is a counterflow plate-type heat exchanger.

In a further aspect, the first coolant is at least one of water and antifreeze.

In an additional aspect, a temperature of the first coolant supplied to the at least one air-to-liquid heat exchanger is substantially constant.

In a further aspect, the temperature of the first coolant supplied to the at least one air-to-liquid heat exchanger is between 8 degrees Celsius and 18 degrees Celsius.

In an additional aspect, a temperature of the first coolant downstream of the at least one air-to-liquid heat exchanger and upstream of the liquid-to-liquid heat exchanger is at least 18 degrees Celsius.

In a further aspect, a temperature of the first coolant downstream of the at least one air-to-liquid heat exchanger and upstream of the liquid-to-liquid heat exchanger is at least 18 degrees Celsius.

In an additional aspect, the temperature of the first coolant downstream of the at least one air-to-liquid heat exchanger and upstream of the liquid-to-liquid heat exchanger is at least 22 degrees Celsius.

In another aspect, the present provides a data center having a room having a cold aisle and a hot aisle, a plurality of electronic components disposed between the cold aisle and the hot aisle, air in the room circulating through the plurality of electronic components from the cold aisle to the hot aisle, the data center cooling system described above, the at least one air-to-liquid heat exchanger being disposed between the hot aisle and the cold aisle, and at least one fan circulating air through the at least one air-to-liquid heat exchanger from the hot aisle to the cold aisle.

In a further aspect, a temperature of the hot aisle is between 26 degrees Celsius and 38 degrees Celsius and a temperature of the cold aisle is between 15 degrees Celsius and 25 degrees Celsius.

In an additional aspect, the at least one fan is at least one first fan and an air supply system is fluidly connected to the room for supplying air from outside the room to the room. The air supply system includes an air filter, and a second fan supplying air from outside the room to the room.

For purposes of this application, the term "free cooling unit" means a unit that makes use of external air temperatures to cool water or other coolant. It should be understood that the "free cooling" obtained from the free cooling unit is not entirely free since at least one pump typically needs to be used to run the water or other coolant through the free cooling unit and since at least one fan is typically used to direct and increase the flow rate of external air through the free cooling unit. Examples of free cooling units include, but are not limited to, cooling towers and dry coolers.

Embodiments of the present invention each have at least one of the above-mentioned object and/or aspects, but do not necessarily have all of them. It should be understood that some aspects of the present invention that have resulted from attempting to attain the above-mentioned object may not satisfy this object and/or may satisfy other objects not specifically recited herein.

Additional and/or alternative features, aspects, and advantages of embodiments of the present invention will become apparent from the following description, the accompanying drawings, and the appended claims.

BRIEF DESCRIPTION OF THE DRAWINGS

For a better understanding of the present invention, as well as other aspects and further features thereof, reference is made to the following description which is to be used in conjunction with the accompanying drawings, where:

FIG. 4 is a schematic representation of a chiller of the coolant cooling system of FIG. 3;

FIG. 5 is a schematic representation of a cooling tower of the coolant cooling system of FIG. 3;

FIG. 8 is a schematic representation of an alternative embodiment of an outside air supply system of the data center of FIG. 1.

DETAILED DESCRIPTION

Figure 1:
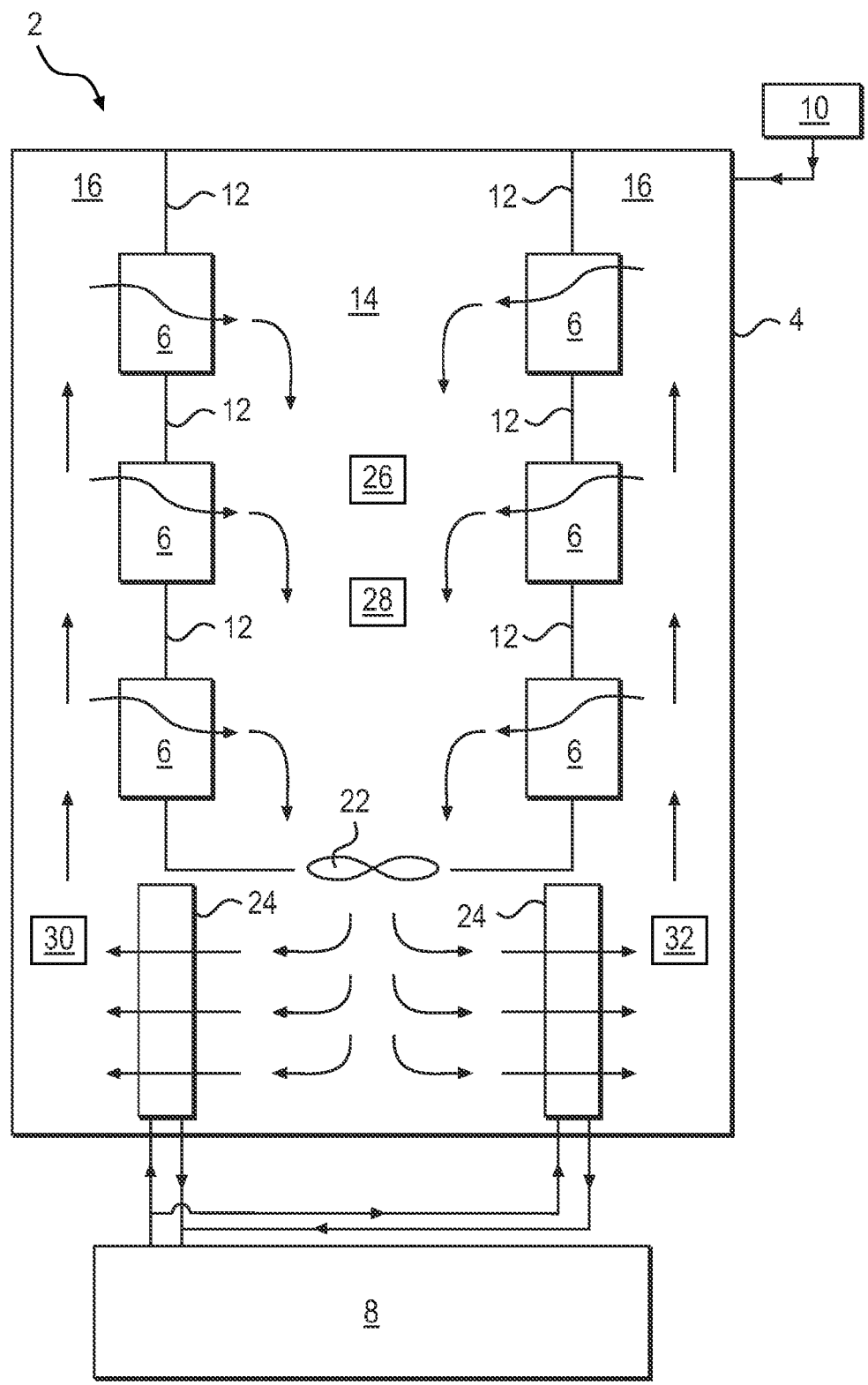
FIG. 1 is a schematic side elevation view of a section of data center having a cooling system.

FIG. 1 illustrates a data center 2 including a data center room 4 containing a number of electronic equipment racks 6, a coolant cooling system 8, and an outside air supply system 10.

In this embodiment, the racks 6 are arranged to form rings of racks 6 over various levels. It is contemplated that instead of being arranged to form rings, the racks 6 on each level could be arranged to form a square, hexagon, octagon each having one or more racks 6 per side or any other configuration that the room 4 will accommodate. Although only six racks 6 disposed in three levels are shown in the room 4 for ease of illustration, it should be understood that it is contemplated that the room 4 could contain hundreds of such racks disposed over more than three levels. It is contemplated that the room 4 could be of any other shape. For example, it is contemplated that the room 4 could have a rectangular or circular cross-section. It is contemplated that in an embodiment where the room 4 has a rectangular cross-section, the racks 6 could be disposed over a single level such that FIG. 1 would illustrate a plan view of such a room. It is also contemplated that the room 4 could have a single row of racks 6, in which case the racks 6 would separate the room into two aisles. Other configurations of the racks 6 inside a room 4 are contemplated. It is contemplated that floors and/or bridges (not shown) could be provided between each level of racks 6 to facilitate access to the racks 6. The floors and bridges should however have a lattice structure, a grill structure or any other structure defining apertures therein such that the flow of air from one level of racks 6 to the other is not impeded too much by the presence of the floors and bridges.

Partitions 12 are disposed between each level of racks 6. Other partitions (not shown) are also disposed between adjacent racks 6 of a same level. The partitions and the racks 6 thus form a central aisle 14 and an outer aisle 16 inside the room 4. It is contemplated that one or more of the partitions could be provided with a door to provide access to the central aisle 14.

Figure 2:
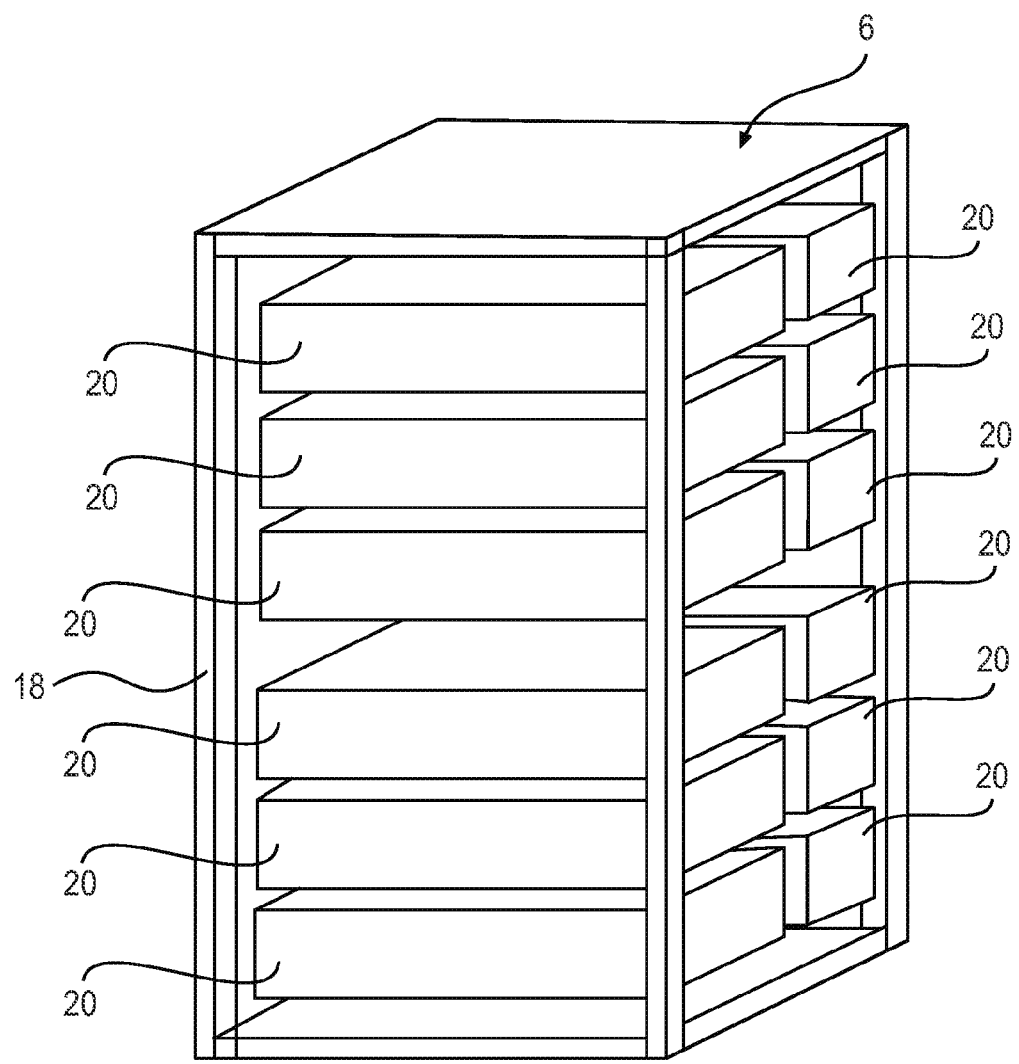
FIG. 2 is a perspective view of a rack of the data center of FIG. 1 with electronic components stored in the rack.

FIG. 2 schematically illustrates one possible embodiment of a rack 6. The rack 6 includes a frame 18 having a number of brackets and/or shelves (not shown) supporting electronic components 20 thereon. The electronic components 20 include, but are not limited to, general or special purpose computers, servers, electronic data storage, telecommunication devices, and combinations thereof. Although the frame 18 shown in FIG. 2 has four open sides, it is contemplated that the frame 18 could have only two open sides, such that when the rack 6 is installed in the room 4, one side faces the central aisle 14 and the other side faces the outer aisle 16. At least some of the electronic components 20 are provided with fans (not shown) used to create a flow of air over at least some of the hardware in these components 20 so as to remove heat therefrom. The electronic components 20 having fans are arranged in the racks 6 such that the fans take air from the outer aisle 16 and blow it in the central aisle 14.

Returning to FIG. 1, a fan 22 is disposed near a bottom of the central aisle 14. It is contemplated that more than one fan 22 could be provided. The fan 22 is an axial fan, but it is contemplated that other types of fans could be used. The fan 22 takes air in the central aisle 14 and pushes the air through air-to-liquid heat exchangers 24. The heat exchangers 24 are arranged in a configuration similar to that of the racks 6, but it is contemplated that they could be disposed in a different configuration. In an exemplary embodiment, the heat exchangers 24 are cooling coils, but it is contemplated that other types of air-to-liquid heat exchangers 24 could be used. As will be explained in greater detail below, as the air flows through the heat exchangers 24, heat from the air is transferred to the coolant flowing in the heat exchangers 24. As a result the air is cooled. The cool air then flows upwardly in the outer aisle 16. As will be described below, the speed of the fan 22 is controlled such that the air pressure in the outer aisle 16 is slightly higher than the air pressure in the central aisle, and as a result, the cool air flows from the outer aisle 16 to the central aisle 14 through the racks 6 and the electronic components 20. As it flows through the racks 6 and the electronic components 20, the heat generated by the hardware of the electronic components 20 is transferred to the air. As a result, the electronic components 20 are cooled. For electronic components 20 provided with fans, the fans are used to increase the flow of air over their associated hardware and therefore increase the rate of heat transfer from the hardware to the air, thus assisting in efficient operation of the electronic components 20 and helping to prevent the failure of the electronic components 20 due to overheating. It is contemplated that such fans could be used only when the temperature of the hardware exceeds a predetermined temperature. It is contemplated that fans could be mounted to the racks 6 to increase the flow of air therethrough. The air entering the central aisle 14 after passing through the racks 6 and the electronic components 20 is therefore warmer than the air in the outer aisle 16. For this reason, the central aisle 14 and the outer aisle 16 will also be referred to herein as the hot aisle 14 and the cold aisle 16 respectively. The fan 22 continuously recirculates the air from the hot aisle 14, through the heat exchangers 24, to the cold aisle 16, through the racks 6 and the electronic components 20, and back to the hot aisle 14 as described above. It is contemplated that instead of having a fan 22 disposed in the hot aisle 14 that pushes the air from the hot aisle 14 through the heat exchangers 24, that fans could be provided in the cold aisle 16 that would pull the air from the hot aisle 14 through the racks 6 and the electronic components 20.

In an exemplary embodiment, the heat exchangers 24 are designed such that at full capacity of the room 4 (i.e. a room filled with the maximum number of operating electronic components for which it has been designed) air entering the heat exchangers 24 at a temperature between 26 and 38 degrees Celsius from the hot aisle 14 leaves the heat exchangers 24 at a temperature between 15 and 25 degrees Celsius. In another exemplary embodiment, the speed of the fan 22 and of the coolant flowing through the heat exchangers 24 are controlled such that the temperatures in the hot and cold aisles 14, 16 are maintained at or near (i.e. plus or minus 0.5 degrees Celsius) predetermined temperatures within the above-mentioned ranges.

One or more temperature sensors 26 and one or more air pressure sensors 28 are provided in the hot aisle 14. Similarly, one or more temperature sensors 30 and one or more air pressure sensors 32 are provided in the cold aisle 16. These are used to control the temperature and pressure in the hot and cold aisles 14, 16. The temperature and pressure in the hot and cold aisles 14, 16 can fluctuate, for example, as electronic components 20 are turned on and off, based on fluctuating levels of power supplied to the electronic components 20, due to the addition and removal of electronic components 20 in the room 4 which increases or reduces the amount of heat generated in the room 4, due to apertures being formed or blocked between the hot and cold aisles 14, 16 as a result of the addition and removal of electronic components 20 in racks 6 which affects the flow of air between the hot and cold aisles 14, 16, and by the opening and closing of doors between the hot and cold aisles 14, 16 or to access the room 4.

In order to control the temperature in the hot aisle 14, a control unit (not shown) controls the speed of the fan 22 based on the readings obtained from the temperature sensor(s) 26 and the air pressure sensors 28 and 32. If it is determined that the temperature in the hot aisle 14 is below the desired temperature, the speed of the fan 22 is decreased such that the air pressure in the cold aisle 16 is decreased relative to the air pressure in the hot aisle 14, thus lowering the speed of the air flowing through the racks 6 and the electronic components 22. However, the air pressure in the cold aisle 16 should not be lowered below the air pressure in the hot aisle 14, which would cause the air to flow through the racks 6 and electronic components 20 from the hot aisle 14 to the cold aisle 16. When the air pressure in the cold aisle 14 is the same as the air pressure in the hot aisle 16, the flow of air through the electronic components 20 is generated by the fans of the electronic components 20 provided with such fans. If it is determined that the temperature in the hot aisle 14 is above the desired temperature, the speed of the fan 22 is increased such that the air pressure in the cold aisle 16 is increased relative to the air pressure in the hot aisle 14, thus increasing the speed of the air flowing through the racks 6 and the electronic components 20. However, it is contemplated that control unit could prevent the air pressure in the cold aisle 16 to exceed a predetermined pressure difference with the hot aisle 14. In an exemplary embodiment, the speed of the fan 22 is controlled such that the air pressure in the cold aisle 16 is between 0 and 50 Pascal above the air pressure in the hot aisle 14.

In order to control the temperature in the cold aisle 16, the control unit mentioned above or a different control unit controls the flow rate of coolant in the heat exchangers 24 via a valve (not shown) based on the readings obtained from the temperature sensor(s) 30. As will be explained below, a temperature of the coolant entering the heat exchangers 24 is controlled to be substantially constant. If it is determined that the temperature in the cold aisle 16 is below the desired temperature, the flow rate of coolant in the heat exchangers 24 is reduced. If it is determined that the temperature in the cold aisle 16 is above the desired temperature, the flow rate of coolant in the heat exchangers 24 is increased.

In an alternative embodiment, it is contemplated that the temperature in the cold aisle 16 can be controlled by controlling a temperature of the coolant entering the heat exchangers 24. If it is determined that the temperature in the cold aisle 16 is below the desired temperature, the temperature of the coolant supplied to the heat exchangers 24 is increased. If it is determined that the temperature in the cold aisle 16 is above the desired temperature, the temperature of the coolant in supplied to the heat exchangers 24 is decreased.

For reasons explained below, the heat exchangers 24 are filterless (i.e. not provided with air filters). As such, the fan 22 can operate at lower speeds than would otherwise be required had air filters been provided upstream or downstream of the heat exchangers since the fan 22 does not need to compensate for the head loss that the air filters would have caused. These lower fan speeds can result in substantial power savings. The coolant used in the heat exchangers 24 is water. However, it is contemplated that other types of coolant could be used such as, for example, antifreeze or a water-antifreeze solution. One example of antifreeze is glycol, but it is contemplated that other antifreezes could be used. The heat exchangers 24 are connected in parallel to the coolant cooling system 8. The heat exchangers 24 and the coolant cooling system 8 together form a cooling system of the data center 2. The hot coolant leaving the heat exchangers 24 enters the coolant cooling system 8 where it is cooled as will be described in greater detail below and is then returned to the heat exchangers 24. It is contemplated that the same coolant cooling system 8 could be used to cool the coolant used in the heat exchangers 24 of more than one data center room 4 by connecting the heat exchangers 24 in parallel to the coolant cooling system 8. It is also contemplated that multiple coolant cooling systems 8 could be connected in parallel with each other.

As would be appreciated, it is difficult to build a perfectly air tight room. The connection between the structural components of the room, the apertures formed in the structure for running wires into and out of the room (power, telecommunication, etc.) and doors to provide access to the room are all examples of reasons which makes this difficult. Therefore, air outside a room which is not air tight could enter the room and affect the temperature, pressure and humidity level in the room and could carry dust with it. As would be understood, this would affect the efficiency of the room. To overcome this, the air pressure inside the data center room 4 as determined by the air pressure sensors 28, 32 is maintained slightly above the air pressure outside of the room 4 as determined by an air pressure sensor (not shown) disposed outside of the room 4. This causes a slight flow of air out of the room 4 which prevents the entry of outside air and dust. To make up for this loss of air inside the room 4 and to maintain the pressure inside the room 4, the air supply system 10 continuously supplies air from outside the room 4 into the room 4. As will be described in greater detail below, the air supply system 10 conditions the outside air prior to supplying it to the room 4.

Figure 3:
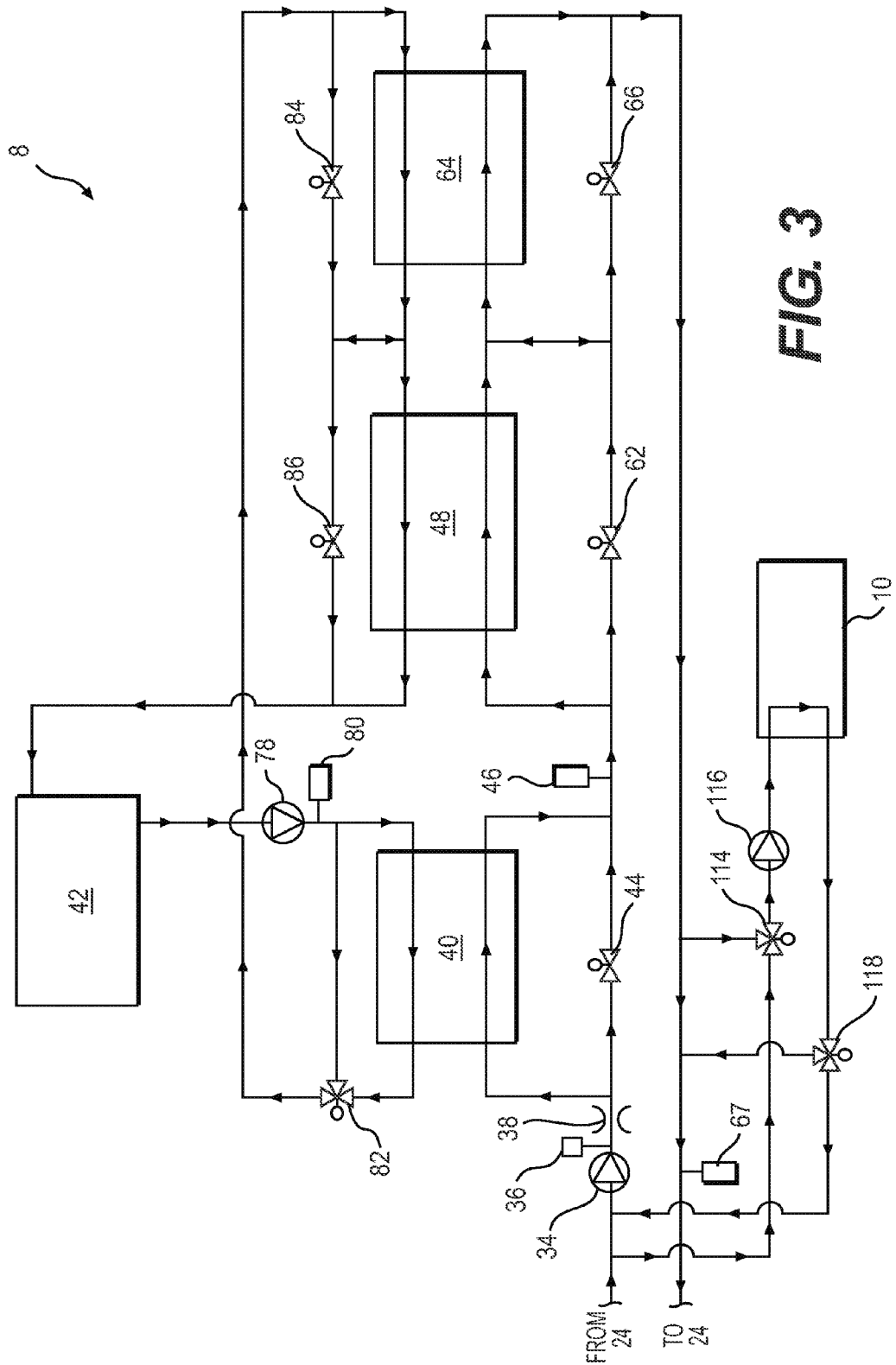
FIG. 3 is a schematic representation of the coolant cooling system of the data center of FIG. 1.

Turning now to FIG. 3, the coolant cooling system 8 will be described in more detail. Although, as explained above, it is contemplated that various types of coolant could be used, the coolant cooling system 8 will be described for water being used as the coolant. The coolant cooling system 8 supplies the water to the heat exchangers 24 at a substantially constant (i.e. plus or minus 0.5 degrees Celsius) predetermined temperature. In an exemplary embodiment, this predetermined temperature is between 8 and 18 degrees Celsius. This is higher than the temperature of 7 degrees Celsius typically found in these types of applications. The temperature of the water being returned to the coolant cooling system 8 from the heat exchangers 24 will depend on the temperature of the water entering the heat exchangers 24, the design of the heat exchangers 24, the flow rate of water through the heat exchangers 24, the temperature of the hot and cold aisles 14, 16, and the speed of the fan 22. In an exemplary embodiment, the temperature of the water being returned to the coolant cooling system 8 from the heat exchangers 24 is at least 18 degrees Celsius. In another exemplary embodiment, this temperature is at least 22 degrees Celsius. This is higher than the temperature of 12.2 degrees Celsius typically found in these types of applications.

By using heat exchangers 24 having higher entry and exit coolant temperatures than typically used in this type of application (i.e. data center cooling) it has been found that the efficiency of the data center cooling system can be improved. Combining this with the slower fan speed possible by eliminating the air filters in the room 4 further increases the efficiency.

As can be seen in FIG. 3, water entering the coolant cooling system 8 first flows through a pump 34. The pump 34 pumps the water from the heat exchangers 24, causes it to flow through the coolant cooling system 8, and through the heat exchangers. It is contemplated that more than one pump 34 could be provided. It is also contemplated that the pump 34 could be provided elsewhere between the outlets of the heat exchangers 24 and the inlets of the heat exchangers 24. A temperature sensor 36 senses a temperature of the water exiting the pump 34. A flow meter 38 senses the flow rate of the water exiting the pump 34. It is contemplated that the flow meter 38 could be disposed upstream of the temperature sensor 36.

From the flow meter 38, the water selectively flows through a liquid-to-liquid heat exchanger 40 to be cooled. In the present embodiment, the heat exchanger 40 is a counterflow plate-type heat exchanger. It is contemplated that other types of liquid-to-liquid heat exchangers could be used, such as a shell and tube heat exchanger. As will be explained in greater detail below, the coolant used to cool the water flowing from the flow meter 38 is water supplied from a free cooling unit in the form of cooling tower 42. It is contemplated that when the coolant used in the heat exchangers 24 and the coolant used in the free cooling unit are the same, that the liquid-to-liquid heat exchanger could be a hydraulic bridge inside which both of the coolant flows are mixed. It is also contemplated that more than one liquid-to-liquid heat exchanger 40 could be provided. It is contemplated that more than one free cooling unit, such as cooling tower 42, could be provided. A valve 44 can be opened to permit a majority of the water flowing from the flow meter 38 to bypass the heat exchanger 40 for reasons described below. It is contemplated that the valve 44 could be replaced by a three-way valve such that all of the water flowing from the flow meter 38 flows through the heat exchanger 40 or bypasses the heat exchanger 40.

A temperature sensor 46 senses the temperature of the water exiting the heat exchanger 40 and/or the valve 44. From the heat exchanger 40 and/or the valve 44, the water selectively flows through a chiller 48 connected in series with the heat exchanger 40. The chiller 48 is a vapor-compression chiller, however it is contemplated that other types of chillers could be used. It is contemplated that more than one chiller 48 could be provided.

As can be seen in FIG. 4, the chiller 48 includes an evaporator 50 through which water from the heat exchanger 40 and/or the valve 44 flows, a condenser 52 through which water from the cooling tower 42 flows, a refrigerant loop 54 inside which a refrigerant flows, a compressor 56 fluidly connected to the refrigerant loop 54, a motor 58 driving the compressor 56, and a throttle valve 60 fluidly connected to the refrigerant loop 54. The refrigerant enters the compressor 56 as a saturated vapor. The compressor 56 compresses this refrigerant vapor, thereby increasing its temperature. This refrigerant vapor then flows through the condenser 52. In the condenser 52, the water from the cooling tower 52 absorbs heat from the refrigerant, causing it to cool and condense into a liquid. The liquid refrigerant then flows through the throttle valve 60. This causes the refrigerant to experience a sudden drop in pressure that causes a portion of the liquid refrigerant to flash evaporate. This lowers the temperature of the liquid and vapor refrigerant mixture below the temperature of the water entering the evaporator 50. This refrigerant mixture then flows through the evaporator 50 and absorbs heat from the water flowing in the evaporator 50. This causes the liquid portion of the refrigerant mixture to evaporate and the temperature of the water to be reduced. The refrigerant then flows back through the compressor 56 and the cycle is repeated. The chiller 48 is provided with temperature sensors (not shown) sensing the entry and exit temperatures of the water flowing through the evaporator 50 and through the condenser 52. It is contemplated that these temperature sensors could be provided externally of the chiller 48.

As can be seen in FIG. 3, a valve 62 can be opened to permit a majority of the water flowing from the heat exchanger 40 and/or the valve 44 to bypass the chiller 48 for reasons described below. It is contemplated that the valve 62 could be replaced by a three-way valve such that all of the water flowing from the heat exchanger 40 and/or the valve 44 flows either through the chiller 48 or bypasses the chiller 48.

From the chiller 48 and/or the valve 62, the water selectively flows through a chiller 64 connected in series with the chiller 48. The chiller 64 is a vapor-compression chiller of the same type and cooling capacity as the chiller 48. As such the chiller 64 operates in the same manner as the chiller 48 and its operation will therefore not be described herein. It is contemplated that the chiller 64 could be of a different type and/or have a different cooling capacity than the chiller 48. It is also contemplated that more than one chiller 64 could be provided. A valve 66 can be opened to permit a majority of the water flowing from the chiller 48 and/or the valve 62 to bypass the chiller 64 for reasons described below. It is contemplated that the valve 66 could be replaced by a three-way valve such that all of the water flowing from the chiller 48 and/or the valve 62 flows either through the chiller 64 or bypasses the chiller 64.

From the chiller 64 and/or the valve 66, the cooled water is returned to the heat exchangers 24 to cool the air in the room 4 as described above. A temperature sensor 67 senses the temperature of the water supplied to the heat exchangers 24.

Turning now to FIG. 5, the cooling tower 42 will be described. In this figure, the flow of water is illustrated by black arrows and the flow of air by white arrows. The cooling tower 42 is an open circuit, induced draft, counterflow cooling tower. It is contemplated that other types of cooling towers could be used. The cooling tower 42 has a fan 68 at a top thereof that draws outside air into the cooling tower 42 near a bottom thereof and causes it to flow upwardly through the cooling tower 42. It is contemplated that more than one fan 68 could be used. Water to be cooled by the cooling tower 42 is supplied to a pipe 70 near a top of the cooling tower 42. Nozzles 72 connected to the pipe 70 spray the water inside the cooling tower 42. The sprayed water flows down in the cooling tower 42 by gravity. As the sprayed water flows against the flow of air in the cooling tower 42, a portion of the water evaporates, thereby reducing the temperature of the remaining water. To increase the contact surface between the water and the air and the time of contact between the two in order to increase the cooling of the water, the sprayed water flows over fill material 74. It is contemplated that the fill material 74 could be omitted. The cooled water collects in a basin 76 at the bottom of the cooling tower 42. The temperature of the water collecting in the basin 76 depends on the temperature and humidity of the air flowing in the cooling tower 42 and the temperature of the water entering the cooling tower 42 to be cooled. From the basin 76, the cooled water flows in the coolant cooling system as described below. Since a certain amount of water evaporates during the cooling process, a water supply system (not shown) is provided to add water in the basin 76 (or at any other point in the cooling tower 42 or its associated water circuit) to make up for the evaporated water.

A pump 78 pumps the water from the basin 76 of the cooling tower 42 and causes it to flow through the circuit described below and to return to the pipe 70 of the cooling tower 42. It is contemplated that the pump 78 could be provided elsewhere along the circuit described below. It is also contemplated that more than one pump 78 could be provided. A temperature sensor 80 senses a temperature of the water exiting the pump 78. From the pump 78, the water flows through the heat exchanger 40 to cool the water coming from the heat exchangers 24 or bypasses the heat exchanger 40 depending on a position of a three-way valve 82. When the temperature sensed by the temperature sensor 80 is below the temperature sensed by the temperature sensor 36 by at least a predetermined amount, the valve 82 is positioned such that water flowing from the pump 78 flows through the heat exchanger 40 and the valve 44 is closed such that water flowing from the pump 34 also flows through the heat exchanger 40. As a result, water flowing from the pump 34 is cooled by the water flowing from the cooling tower 42. In an exemplary embodiment, the temperature sensed by the temperature sensor 80 has to be between 0.1 and 10 degrees below the temperature sensed by the temperature sensor 36 for the heat exchanger 40 to be used to cool the water flowing from the pump 34 as described above. However it is contemplated that this amount could be higher than 10 degrees. When the temperature sensed by the temperature sensor 80 is above the temperature sensed by the temperature sensor 36 or below the temperature sensed by the temperature sensor 36 by less than the predetermined amount, the valve 82 is positioned such that water from the pump 78 bypasses the heat exchanger 40 and the valve 44 is opened such that a majority of water from the heat exchanger 24 also flows through the heat exchanger 40.

From the valve 82, the water selectively flows through the chiller 64 to cool the refrigerant therein. A valve 84 can be opened to permit a majority of the water flowing from the valve 82 to bypass the chiller 64 for reasons described below. It is contemplated that the valve 84 could be replaced by a three-way valve such that all of the water flowing from the valve 82 flows either through the chiller 64 or bypasses the chiller 64. When the chiller 64 is to be used to cool the water used in the heat exchangers 24, both of the valves 66 and 84 are closed and the motor of the chiller 64 is turned on. Otherwise, both of the valves 66 and 84 are opened and the motor of the chiller 64 is turned off.

From the chiller 64 and/or valve 84, the water selectively flows through the chiller 48 to cool the refrigerant therein. A valve 86 can be opened to permit a majority of the water flowing from the chiller 64 and/or valve 84 to bypass the chiller 48 for reasons described below. It is contemplated that the valve 86 could be replaced by a three-way valve such that all of the water flowing from the chiller 64 and/or valve 84 flows either through the chiller 48 or bypasses the chiller 48. When the chiller 48 is to be used to cool the water used in the heat exchangers 24, both of the valves 62 and 86 are closed and the motor 58 of the chiller 48 is turned on. Otherwise, both of the valves 62 and 86 are opened and the motor 58 of the chiller 48 is turned off.

From the chiller 48 and/or valve 86, the water flows to the pipe 70 of the cooling tower 42 to be cooled and recirculated through the circuit described above.

Figure 6:
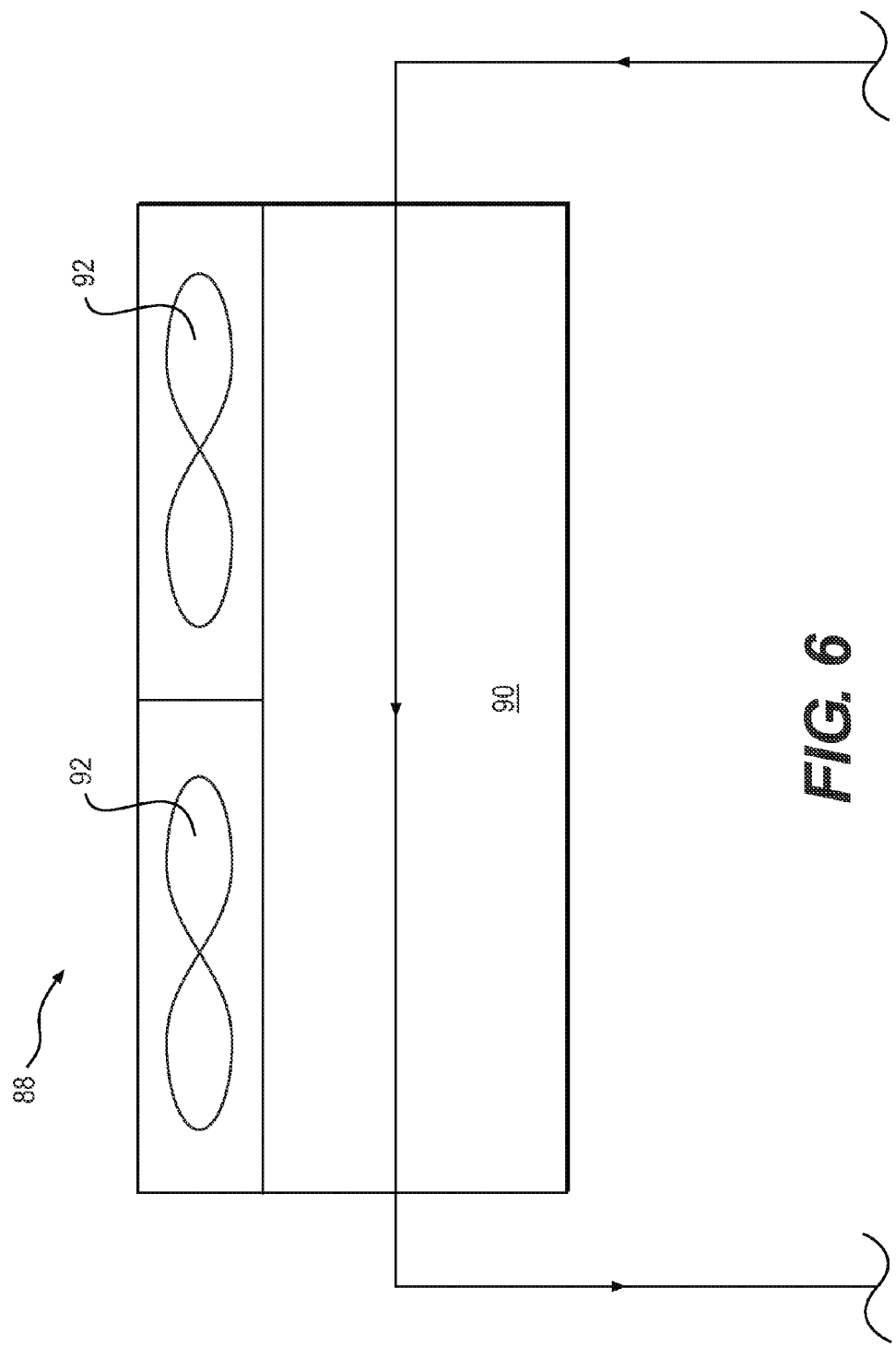
FIG. 6 is a schematic representation of a dry cooler that can be used in the coolant cooling system of FIG. 3 as an alternative to the cooling tower of FIG. 5.

It is contemplated that the cooling tower 42 could be replaced by a dry cooler 88, such as the one shown in FIG. 6. The dry cooler 88 includes an air-to-liquid heat exchanger 90 disposed outside and through which a coolant to be cooled flows. A pair of fans 92 induces a flow of ambient air over the heat exchanger 90 to cool the coolant flowing therein. It is contemplated that only one or more than two fans 92 could be used. If the data center 2 is installed in a region where the temperature typically remains above 0 degree Celsius, water can be used as the coolant in the dry cooler 88. Otherwise, a coolant having a lower freezing temperature, such as antifreeze or a water-antifreeze solution, should be used. From the heat exchanger 90 of the dry cooler 88, the coolant flows through the same circuit as the water from the cooling tower 42 described above. It is contemplated that the cooling tower 42 could also be replaced by other types of free cooling units.

Although some temperature sensors and a flow meter have been described above, it is contemplated that the coolant cooling system 8 could be provided with additional temperature sensors and flow meters that could be used in controlling the coolant cooling system 8 and/or to monitor the operation of the coolant cooling system 8.

When the temperature of the water sensed by the temperature sensor 46 corresponds, within a certain tolerance level, to the predetermined temperature at which the water is to be supplied to the heat exchangers 24 as a result of the cooling thereof by the heat exchanger 40, the chillers 48 and 64 do not need to be used. As such all of the valves 62, 66, 84 and 86 are opened.

When the temperature of the water sensed by the temperature sensor 46 is less than the predetermined temperature at which the water is to be supplied to the heat exchangers 24 as a result of the cooling thereof by the heat exchanger 40, the speed of the fan 68 of the cooling tower 42 and/or the speed of the pump 78 is/are adjusted in order to increase the temperature of the water exiting the heat exchanger 40 and sensed by the temperature sensor 46 to the predetermined temperature. Alternatively, it is contemplated that the valve 44 could be partially opened such that a temperature of the water resulting from the mix of water flowing through the heat exchanger 40 and of water bypassing the heat exchanger 40 corresponds to the predetermined temperature. Under such conditions, the chillers 48 and 64 do not need to be used and the valves 62, 66, 84 and 86 are opened.

When the temperature of the water sensed by the temperature sensor 46 is above the predetermined temperature at which the water is to be supplied to the heat exchangers 24 either as a result of insufficient cooling thereof by the heat exchanger 40 or as a result of the water bypassing the heat exchanger 40, it is first determined if only one or both of the chillers 48 and 64 are needed to reduce the temperature of the water to the predetermined temperature before it is supplied to the heat exchangers 24. This is done based at least in part on the difference between the temperature sensed by the temperature sensor 46 and the predetermined temperature at which the water is to be supplied to the heat exchangers and by the flow rate of the water as sensed by the flow meter 38.

If it is determined that both chillers 48 and 64 are to be used, all of the valves 62, 66, 84 and 86 are closed. In an exemplary embodiment, each one of the chillers 48 and 64 is controlled so as to reduce the temperature of the water by half of what is needed to bring it to the predetermined temperature at which it is to be supplied to the heat exchangers 24. For example, when the temperature sensor 46 senses a water temperature of 12 degrees above the predetermined temperature at which the water is to be supplied to the heat exchangers 24, the chiller 48 is controlled to reduce the water temperature by 6 degrees and the chiller 64 is controlled to reduce the water temperature by 6 degrees.

If it is determined that only one of the chillers 48 and 64 is to be used, then the one of the chillers 48 and 64 which can reduce the temperature of the water most efficiently is used. This is usually the chiller 48, in which case the valves 62 and 86 are closed and the valves 66 and 84 are opened. However it is contemplated that under certain conditions, the chiller 64 could be the one that is used, in which case the valves 66 and 84 are closed and the valves 62 and 86 are opened.

In an exemplary embodiment, it is determined that only one of the chillers 48 and 64 can be used only if the temperature of the water can be reduced to the predetermined temperature by one of the chillers 48 and 64 operating at a fraction of its maximum cooling capacity. Otherwise, both chillers 48 and 64 are used.

If the temperature of the water sensed by the temperature sensor 67 is outside a narrow range above or below the predetermined temperature at which water is to be supplied to the heat exchangers 24, the operation of the heat exchanger 40 and of the chillers 48 and 64 is adjusted accordingly.

Figure 7:
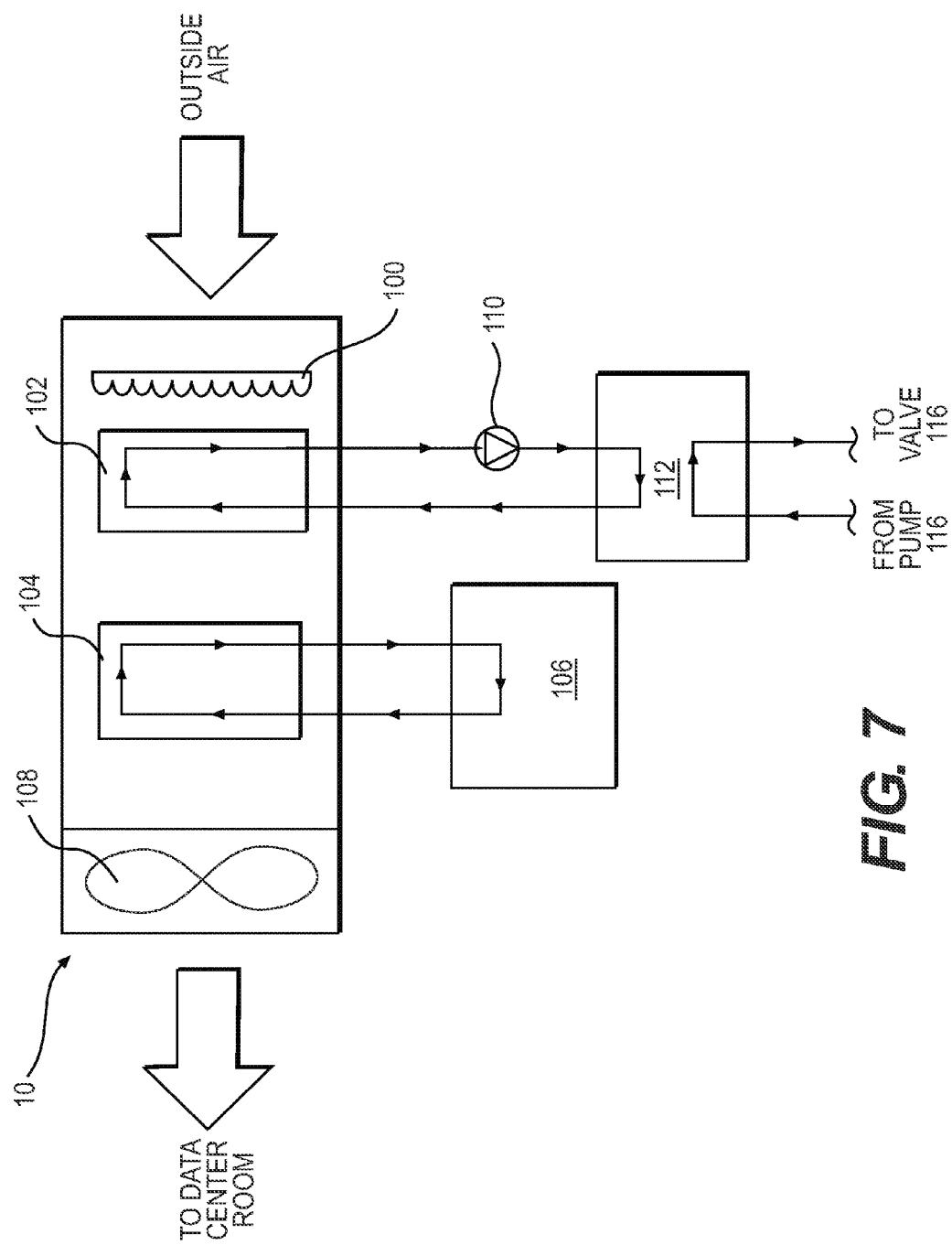
FIG. 7 is a schematic representation of an outside air supply system of the data center of FIG. 1.

Turning now to FIG. 7, the outside air supply system 10 will be described in more detail. Outside air entering the air supply system 10 first flows through an air filter 100 to remove a larger percentage of dust and particles that could be present in the air. It is contemplated that more than one air filter 100 could be provided. Since the air supplied by the air supply system 10 is filtered and pressurizes the room 4 above the air pressure outside the room 4, air filters are not necessary inside the room 4 to filter the air being circulated therein, thus allowing the fan 22 to operate at lower speeds thereby increasing the efficiency of the data center 2. From the air filter 100, the air flows through an air-to-liquid heat exchanger 102 used to cool or heat the air as described below. The heat exchanger 102 is a coil, but it is contemplated that other types of heat exchangers could be used. From the heat exchanger 102, the air flows through another air-to-coolant heat exchanger 104 used to dehumidify and further cool the air if needed as described below. The heat exchanger 104 is a coil, but it is contemplated that other types of heat exchangers could be used. The coolant flowing through the heat exchanger 104 when it is in operation is cooled by an autonomous refrigeration system 106. The coolant flowing through the heat exchanger 104 is a liquid such as water, an antifreeze, or a solution thereof. As such the air-to-coolant heat exchanger 104 is an air-to-liquid heat exchanger 104. It is contemplated that the coolant flowing through the heat exchanger 104 could be a refrigerant, in which case the air-to-coolant heat exchanger 104 would be an air-to-refrigerant heat exchanger 104. A fan 108 is disposed near the outlet of the air supply system 10. The fan 108 is an axial fan, but it is contemplated that another type of fan, such as a centrifugal fan or a mixed flow fan, could be used. The fan 108 pulls the air through the air supply system 10 and pushes it inside the room 4. In an exemplary embodiment, the air supply system 10 supplies the air to the cold aisle 16. The flow rate of air generated by the fan 108 is lower than the flow rate of air generated by the fan 22. In an exemplary embodiment, the flow rate generated by the fan 108 is between 0.1% and 25% of the flow rate generated by the fan 22. In another exemplary embodiment, the flow rate generated by the fan 108 is between 2% and 5% of the flow rate generated by the fan 22. It is contemplated that the fan 108 and the filter 100 could be disposed elsewhere along the air supply system 10. For example, the fan 108 could be disposed at the inlet of the air supply system 10 and the filter 100 near the outlet of the air supply system.

The heat exchanger 102 has a water-glycol solution circulated therethrough by a pump 110. It is contemplated that a coolant other than a water-glycol solution could be used such as another antifreeze. It is contemplated that more than one pump 110 could be provided. The water-glycol solution also flows through a counterflow plate-type heat exchanger 112 where it is heated or cooled depending on whether the outside air is to be heated or cooled as will be described below. It is contemplated that the heat exchanger 112 could be a different type of liquid-to-liquid heat exchanger, such as, for example, a shell and tube heat exchanger.

The liquid used to heat or cool the water-glycol solution in the heat exchanger 112 is water from the coolant cooling system that is used in the heat exchangers 24. As can be seen in FIG. 3, a three-way valve 114 has a first port connected upstream of the valve 34 to receive hot water from the heat exchangers 24, a second port connected downstream of the chiller 64 and the valve 66 to receive cool water therefrom, and a third port connected to a pump 116. When the water-glycol solution is to be heated in the heat exchanger 112, the valve 114 is positioned so as to supply hot water to the pump 116 which then pumps it through the heat exchanger 112. When the water-glycol solution is to be cooled in the heat exchanger 112, the valve 114 is positioned so as to supply cool water to the pump 116 which then pumps it through the heat exchanger 112. From the heat exchanger 112, the water pumped by the pump 116 is supplied to a three-way valve 118. When the water supplied to the pump 116 is hot water, the valve 118 is positioned to supply the water returning from the heat exchanger 112 upstream of the pump 34 as shown. When the water supplied to the pump 116 is cool water, the valve 118 is positioned to supply the water returning from the heat exchanger 112 downstream of the chiller 64 and the valve 66 as shown.

Although not shown, temperature sensors are provided in the air supply system 10 to sense the temperature of the outside air, of the air flowing out of the heat exchanger 102 and of the air flowing out of the heat exchanger 104. The temperature of the air supplied to the room 4 by the air supply system 10 is controlled by the air supply system so as to be above 0 degree Celsius, to prevent freezing, but below the temperature of the cold aisle 16 as sensed by the temperature sensor(s) 30 in order to prevent water condensation inside the room 4.

When the temperature of the outside air is too low, the water-glycol solution flowing through the heat exchanger 102 is heated as indicated above. The air flowing through the heat exchanger 102 is therefore heated. The speed of the pump 110 and/or of the pump 116 is controlled such that the temperature of the air downstream of the heat exchanger 102 is within the desired range to be supplied to the room 4. The refrigeration system 106 is turned off since under these conditions the heat exchanger 104 is not needed to cool the air.

When the temperature of the outside air is too high, the refrigeration system 106 is turned on and controlled such that the heat exchanger 104 cools the air flowing therethrough. If the resulting temperature of the air downstream of the heat exchanger 104 is within the desired range to be supplied to the room 4, then the pump 110 is turned off since the heat exchanger 102 is not needed to cool the air. If the resulting temperature of the air downstream of the heat exchanger 104 is still above the desired range to be supplied to the room 4, then the pump 110 is turned on and the water-glycol solution flowing through the heat exchanger 102 is cooled as indicated above. The air flowing through the heat exchanger 102 is therefore cooled. The speed of the pump 110 and/or of the pump 116 is controlled such that the temperature of the air flowing through the heat exchanger 102 is reduced efficiently. The refrigeration system 106 is controlled such that the heat exchanger 104 cools the air flowing therethrough to a temperature within the desired range to be supplied to the room 4. When in operation, the heat exchanger 104 also dehumidifies the air flowing therethrough.

It is contemplated that if the data center 2 is installed in a region where the temperature typically remains above 0 degree Celsius, that the water-glycol solution loop, pump 110 and heat exchanger 112 of the air supply system 10 could be omitted and that the hot or cool water supplied by the pump 116 could be supplied directly to the heat exchanger 102 as in the air supply system 10' shown in FIG. 8. The other elements of the air supply system 10' are the same as those of the air supply system 10, as such they have been labelled with the same reference numerals and will not be described again.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

What is claimed is:

1. A data center comprising:
   a room having a cold aisle and a hot aisle;
   a plurality of electronic components disposed between the cold aisle and the hot aisle, air in the room circulating through the plurality of electronic components from the cold aisle to the hot aisle;
   at least one air-to-liquid heat exchanger disposed between the hot aisle and the cold aisle, wherein the at least one air-to-liquid heat exchanger is filterless, there being no filters provided upstream or downstream of the at least one air-to-liquid heat exchanger;
   at least one first fan circulating air in the room at a first flow rate, the at least one first fan circulating air through the at least one air-to-liquid heat exchanger from the hot aisle to the cold aisle; and
   an air supply system fluidly connected to the room for supplying air from outside the room to the room and for pressurizing the room above an air pressure outside the room, the air supply system including:
      an air filter; and a second fan supplying air from outside the room to the room at a second flow rate, the second flow rate being lower than the first flow rate, wherein at least one air temperature sensor is disposed in the hot aisle for sensing an air temperature in the hot aisle;

at least one first air pressure sensor is disposed in the hot aisle for sensing an air pressure in the hot aisle; and at least one second air pressure sensor is disposed in the cold aisle for sensing an air pressure in the cold aisle;

wherein a speed of the at least one first fan is increased to increase the first flow rate such that the air pressure in the cold aisle is increased relative to the hot aisle when the air temperature in the hot aisle is above a predetermined temperature; and wherein the speed of the at least one first fan is decreased to decrease the first flow rate such that the air pressure in the cold aisle is decreased relative to the hot aisle when the air temperature in the hot aisle is below the predetermined temperature.

2. The data center of claim 1, wherein the second flow rate is between 0.1% and 25% of the first flow rate.

3. The data center of claim 2, wherein the second flow rate is between 2% and 5% of the first flow rate.

4. The data center of claim 1, wherein the at least one air-to-liquid heat exchanger is at least one first air-to-liquid heat exchanger; and wherein the air supply system further includes at least one second air-to-liquid heat exchanger, the at least one second fan circulating air through the at least one second air-to-liquid heat exchanger.

5. The data center of claim 4, wherein the at least one second air-to-liquid heat exchanger selectively heats the air from the outside before the air is supplied to the room using hot coolant exiting the at least one first air-to-liquid heat exchanger; and wherein the at least one second air-to-liquid heat exchanger selectively cools the air from the outside before the air is supplied to the room using cool coolant supplied to the at least one first air-to-liquid heat exchanger.

6. The data center of claim 5, further comprising:

a liquid-to-liquid heat exchanger fluidly connected to the at least one second air-to-liquid heat exchanger;

at least one pump circulating coolant between the liquid-to-liquid heat exchanger and the at least one second air-to-liquid heat exchanger; and at least one valve selectively supplying one of the hot coolant and the cool coolant to the liquid-to-liquid heat exchanger.

7. The data center of claim 5, further comprising:

at least one valve selectively supplying one of the hot coolant and the cool coolant to the second air-to-liquid heat exchanger; and at least one pump circulating the one of the hot coolant and the cool coolant through the second air-to-liquid heat exchanger.

8. The data center of claim 5, wherein the air supply system further includes:

an air-to-coolant heat exchanger disposed downstream of at least one second air-to-liquid heat exchanger; and an autonomous refrigeration system fluidly connected to the air-to-coolant heat exchanger, the autonomous refrigeration system cooling coolant flowing through the air-to-coolant heat exchanger.

9. The data center of claim 8, wherein the air-to-coolant heat exchanger is a third air-to-liquid heat exchanger.

10. The data center of claim 5, wherein the hot coolant is at a temperature of at least 18 degrees Celsius and the cool coolant is at a temperature between 8 degrees Celsius and 18 degrees Celsius.

11. The data center of claim 10, wherein the coolant is at least one of water and antifreeze.

12. The data center of claim 1, wherein the second flow rate is substantially constant.

13. The data center of claim 1, wherein the predetermined temperature is between 26 degrees Celsius and 38 degrees Celsius.

14. The data center of claim 1, further comprising at least one air temperature sensor disposed in the cold aisle for sensing an air temperature in the cold aisle;

wherein a flow rate of coolant in the at least one air-to-liquid heat exchanger is increased when the air temperature in the cold aisle is above a predetermined temperature; and wherein the flow rate of coolant in the at least one air-to-liquid heat exchanger is decreased when the air temperature in the cold aisle is below the predetermined temperature.

15. The data center of claim 14, wherein a temperature of coolant supplied to the at least one air-to-liquid heat exchanger is substantially constant.

16. The data center of claim 14, wherein the predetermined temperature is between 15 degrees Celsius and 25 degrees Celsius.

17. The data center of claim 1, further comprising at least one air temperature sensor disposed in the cold aisle for sensing an air temperature in the cold aisle;

wherein a temperature of coolant supplied to the at least one air-to-liquid heat exchanger is decreased when the air temperature in the cold aisle is above a predetermined temperature; and wherein the temperature of coolant supplied to the at least one air-to-liquid heat exchanger is increased when the air temperature in the cold aisle is below the predetermined temperature.

18. The data center of claim 1, further comprising a plurality of racks disposed between the cold aisle and the hot aisle; and wherein the plurality of electronic components is disposed in the plurality of racks.

19. A data center cooling system comprising:

at least one air-to-liquid heat exchanger adapted to cool air from a hot aisle of at least one room of a data center;

a liquid-to-liquid heat exchanger fluidly connected to the at least one air-to-liquid heat exchanger;

a first chiller fluidly connected to the liquid-to-liquid heat exchanger;

a second chiller fluidly connected to the first chiller;

wherein the first and second chillers are vapor-compression chillers including a refrigerant loop inside which a refrigerant flows;

at least one first pump fluidly connected to the at least one air-to-liquid heat exchanger for pumping in a first coolant loop a first coolant from the at least one air-to-liquid heat exchanger, the first coolant flowing selectively to the liquid-to-liquid heat exchanger, and to the first and second chillers prior to flowing back to the at least one air-to-liquid heat exchanger;

a free cooling unit fluidly connected to the liquid-to-liquid heat exchanger for cooling the first coolant flowing therethrough and fluidly connected to the first and second chillers for condensing refrigerant circulated therein; and at least one second pump fluidly connected to the free cooling unit for pumping in a second coolant loop a second coolant from the free cooling unit, the second coolant flowing selectively to the liquid-to-liquid heat exchanger, and to the first and second chillers prior to flowing back to the free cooling unit;

wherein the at least one air-to-liquid heat exchanger, the liquid-to-liquid heat exchanger, the first chiller and the second chiller are fluidly connected in series;

wherein the free cooling unit, the liquid-to-liquid heat exchanger, the first chiller and the second chiller are fluidly connected in series;

wherein when the first coolant flows to the liquid-to-liquid heat exchanger and to the first and second chillers, the first coolant flows sequentially from the at least one air-to-liquid heat exchanger, to the liquid-to-liquid heat exchanger, to the first chiller, to the second chiller, and back to the at least one air-to-liquid heat exchanger in the first coolant loop;

wherein when the second coolant flows to the liquid-to-liquid heat exchanger and to the first and second chillers, the second coolant flows sequentially from the liquid-to-liquid heat exchanger, to the second chiller, to the first chiller, to the free cooling unit, and back to the liquid-to-liquid heat exchanger in the second coolant loop;

wherein respective valves are provided to selectively bypass each of the liquid-to-liquid heat exchanger, the first chiller, and the second chiller.

20. The data center cooling system of claim 19, wherein the free cooling unit is a cooling tower; and
wherein the second coolant is water.

21. The data center cooling system of claim 19, wherein the free cooling unit is a dry cooler.

22. The data center cooling system of claim 21, wherein the second coolant is at least in part antifreeze.

23. The data center cooling system of claim 19, wherein the respective valves comprise:
a first valve having a first position where the second coolant flows through the liquid-to-liquid heat exchanger and a second position where at least a portion of the second coolant bypasses the liquid-to-liquid heat exchanger;
a second valve having a first position where the second coolant flows through the first chiller and a second position where at least a portion of the second coolant bypasses the first chiller; and
a third valve having a first position where the second coolant flows through the second chiller and a second position where at least a portion of the second coolant bypasses the second chiller.

24. The data center cooling system of claim 19, wherein the at least one second pump is fluidly connected between the free cooling unit and the liquid-to-liquid heat exchanger.

25. The data center cooling system of claim 19, wherein the respective valves comprise:
a first valve having a first position where the first coolant flows through the liquid-to-liquid heat exchanger and a second position where at least a portion of the first coolant bypasses the liquid-to-liquid heat exchanger;
a second valve having a first position where the first coolant flows through the first chiller and a second position where at least a portion of the first coolant bypasses the first chiller; and
a third valve having a first position where the first coolant flows through the second chiller and a second position where at least a portion of the first coolant bypasses the second chiller.

26. The data center cooling system of claim 25, wherein the respective valves comprise:
a fourth valve having a first position where the second coolant flows through the liquid-to-liquid heat exchanger and a second position where at least a portion of the second coolant bypasses the liquid-to-liquid heat exchanger;
a fifth valve having a first position where the second coolant flows through the first chiller and a second position where at least a portion of the second coolant bypasses the first chiller; and
a sixth valve having a first position where the second coolant flows through the second chiller and a second position where at least a portion of the second coolant bypasses the second chiller;
wherein the fourth valve is in the first position when the first valve is in the first position, the fifth valve is in the first position when the second valve is in the first position, the sixth valve is in the first position when the third valve is in the first position, the fourth valve is in the second position when the first valve is in the second position, the fifth valve is in the second position when the second valve is in the second position, the sixth valve is in the second position when the third valve is in the second position.

27. The data center cooling system of claim 25, further comprising:
a first temperature sensor sensing a temperature of the first coolant upstream of the liquid-to-liquid heat exchanger; and
a second temperature sensor sensing a temperature of the second coolant upstream of the liquid-to-liquid heat exchanger;
wherein the first valve is in the second position at least when the temperature of the second coolant sensed by the second temperature sensor is above the temperature of the first coolant sensed by the first temperature sensor.

28. The data center cooling system of claim 27, wherein the first valve is in the first position when the temperature of the second coolant sensed by the second temperature sensor is below the temperature of the first coolant sensed by the first temperature sensor by at least a predetermined amount.

29. The data center cooling system of claim 28, wherein the predetermined amount is between 0.1 and 10 degrees.

30. The data center cooling system of claim 25, further comprising a temperature sensor sensing a temperature of the first coolant downstream of the liquid-to-liquid heat exchanger and upstream of the first chiller; and
wherein the second valve is in the second position when the temperature of the first coolant sensed by the temperature sensor is at or below a predetermined temperature;
wherein the third valve is in the second position when the temperature of the first coolant sensed by the temperature sensor is at or below the predetermined temperature;
wherein the predetermined temperature is a temperature at which the first coolant is to be supplied to the at least one air-to-liquid heat exchanger.

31. The data center cooling system of claim 30, wherein at least one of the second valve and the third valve is in the first position when the temperature of the first coolant sensed by the temperature sensor is above the predetermined temperature.

32. The data center cooling system of claim 30, wherein, for an equivalent flow rate of the first coolant, one of the second valve and the third valve is in the first position when the temperature of the first coolant sensed by the temperature sensor is above the predetermined temperature by a first amount, and both of the second valve and the third valve are in the first position when the temperature of the first coolant sensed by the temperature sensor is above the predetermined temperature by a second amount, the second amount being greater than the first amount.

33. The data center cooling system of claim 30, wherein the predetermined temperature is between 8 degrees Celsius and 18 degrees Celsius.

34. The data center cooling system of claim 19, wherein the at least one first pump is fluidly connected between the at least one air-to-liquid heat exchanger and the liquid-to-liquid heat exchanger.

35. The data center cooling system of claim 19, wherein the at least one air-to-liquid heat exchanger is a plurality of air-to-liquid heat exchangers fluidly connected in parallel.

36. The data center cooling system of claim 19, wherein the at least one air-to-liquid heat exchanger is at least one coil.

37. The data center cooling system of claim 19, wherein the liquid-to-liquid heat exchanger is a counterflow plate-type heat exchanger.

38. The data center cooling system of claim 19, wherein the first coolant is at least one of water and antifreeze.

39. The data center cooling system of claim 19, wherein a temperature of the first coolant supplied to the at least one air-to-liquid heat exchanger is substantially constant.

40. The data center cooling system of claim 39, wherein the temperature of the first coolant supplied to the at least one air-to-liquid heat exchanger is between 8 degrees Celsius and 18 degrees Celsius.

41. The data center cooling system of claim 40, wherein a temperature of the first coolant downstream of the at least one air-to-liquid heat exchanger and upstream of the liquid-to-liquid heat exchanger is at least 18 degrees Celsius.

42. The data center cooling system of claim 19, wherein a temperature of the first coolant downstream of the at least one air-to-liquid heat exchanger and upstream of the liquid-to-liquid heat exchanger is at least 18 degrees Celsius.

43. The data center cooling system of claim 42, wherein the temperature of the first coolant downstream of the at least one air-to-liquid heat exchanger and upstream of the liquid-to-liquid heat exchanger is at least 22 degrees Celsius.

44. A data center comprising:
a room having a cold aisle and a hot aisle;
a plurality of electronic components disposed between the cold aisle and the hot aisle, air in the room circulating through the plurality of electronic components from the cold aisle to the hot aisle;
the data center cooling system from claim 19, the at least one air-to-liquid heat exchanger being disposed between the hot aisle and the cold aisle; and
at least one fan circulating air through the at least one air-to-liquid heat exchanger from the hot aisle to the cold aisle.

45. The data center of claim 44, wherein a temperature of the hot aisle is between 26 degrees Celsius and 38 degrees Celsius and a temperature of the cold aisle is between 15 degrees Celsius and 25 degrees Celsius.

46. The data center of claim 44, wherein the at least one fan is at least one first fan; and
further comprising an air supply system fluidly connected to the room for supplying air from outside the room to the room, the air supply system including:
an air filter; and
a second fan supplying air from outside the room to the room.

\* \* \* \* \*